(12) United States Patent
Piotr et al.

(10) Patent No.: US 7,498,719 B2
(45) Date of Patent: Mar. 3, 2009

(54) SMALL PIEZOELECTRIC OR ELECTROSTRICTIVE LINEAR MOTOR

(75) Inventors: Vasiljef Piotr, Vilius (LT); Bo Keun Kim, Seongnam (KR); Seok Min Yoon, Seoul (KR); Seong Yil Yoon, Seoul (KR)

(73) Assignee: Piezoelectric Technology Co., Ltd. (KR)

( * ) Notice: Subject to any disclaimer, the term of this patent is extended or adjusted under 35 U.S.C. 154(b) by 140 days.

(21) Appl. No.: 10/578,922

(22) PCT Filed: Feb. 4, 2005

(86) PCT No.: PCT/KR2005/000353

§ 371 (c)(1),
(2), (4) Date: May 9, 2006

(87) PCT Pub. No.: WO2005/083874

PCT Pub. Date: Sep. 9, 2005

(65) Prior Publication Data

US 2007/0120442 A1 May 31, 2007

(30) Foreign Application Priority Data

Mar. 2, 2004 (KR) .................... 10-2004-0014050
Jun. 4, 2004 (KR) .................... 10-2004-0040895

(51) Int. Cl.
*H01L 41/04* (2006.01)
(52) U.S. Cl. ..................................... 310/328
(58) Field of Classification Search ................ 310/328
See application file for complete search history.

(56) References Cited

U.S. PATENT DOCUMENTS

| 3,949,247 | A | * | 4/1976 | Fenner et al. | ............... 310/332 |
| 5,225,941 | A | * | 7/1993 | Saito et al. | ................... 359/824 |
| 5,408,376 | A | * | 4/1995 | Nishikura et al. | ............ 360/292 |
| 5,490,015 | A | * | 2/1996 | Umeyama et al. | ........... 359/824 |
| 5,768,016 | A | * | 6/1998 | Kanbara | ..................... 359/557 |

FOREIGN PATENT DOCUMENTS

| JP | 02-188169 A | 7/1990 |
| JP | 03-178581 A | 8/1991 |
| JP | 63-283478 A | 11/1998 |
| JP | 11-285278 A | 10/1999 |
| JP | 2003-284364 A | 10/2003 |

* cited by examiner

*Primary Examiner*—Jaydi SanMartin
(74) *Attorney, Agent, or Firm*—McNeeley Bodendorf LLP

(57) ABSTRACT

The present invention provides a small piezoelectric/electrostrictive ultrasonic linear motors which are installed in cell phones or PDAs, etc. to drive their camera lenses. In the present invention, a movable shaft (30) is coupled to a unimorph or bimorph, which is made by attaching a piezoelectric or electrostrictive substrate to an elastic body (20) (metal), so that a movable body (40) fitted over the movable shaft (30) is linearly moved along the movable shaft (30) by vibration of the piezoelectric or electrostrictive substrate, thus simplifying a manufacturing process, being easily practicable according to a basic principle, and having superior characteristics.

19 Claims, 8 Drawing Sheets

[FIG. 1]
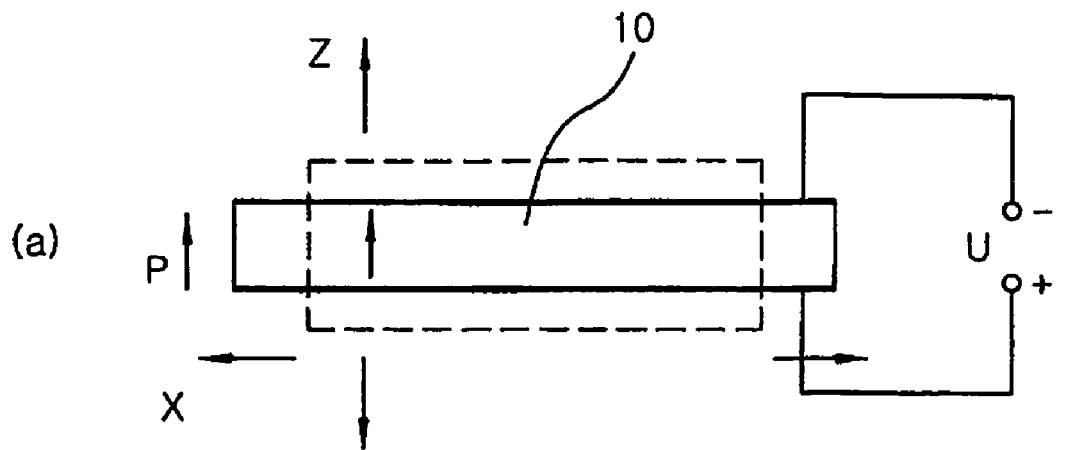
(a)
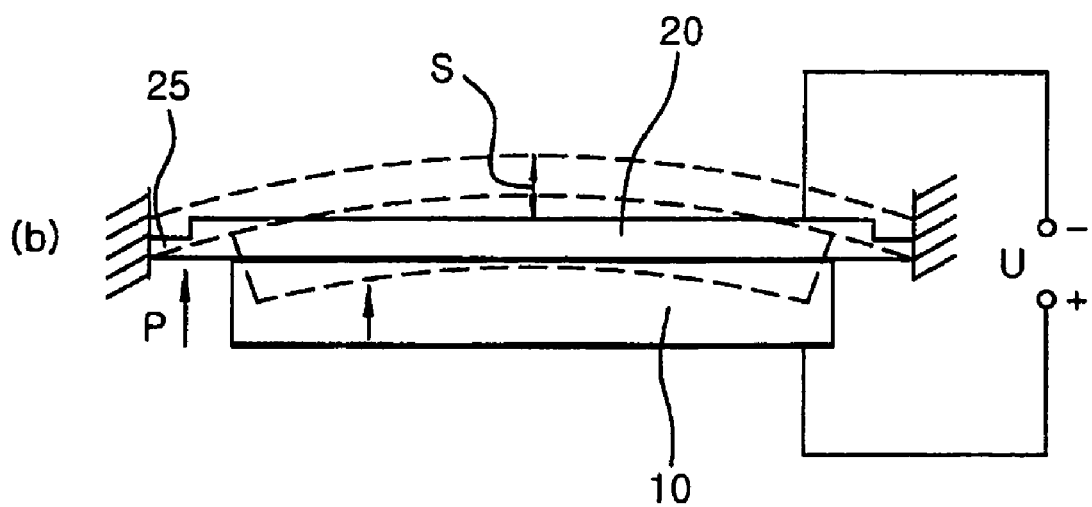
(b)
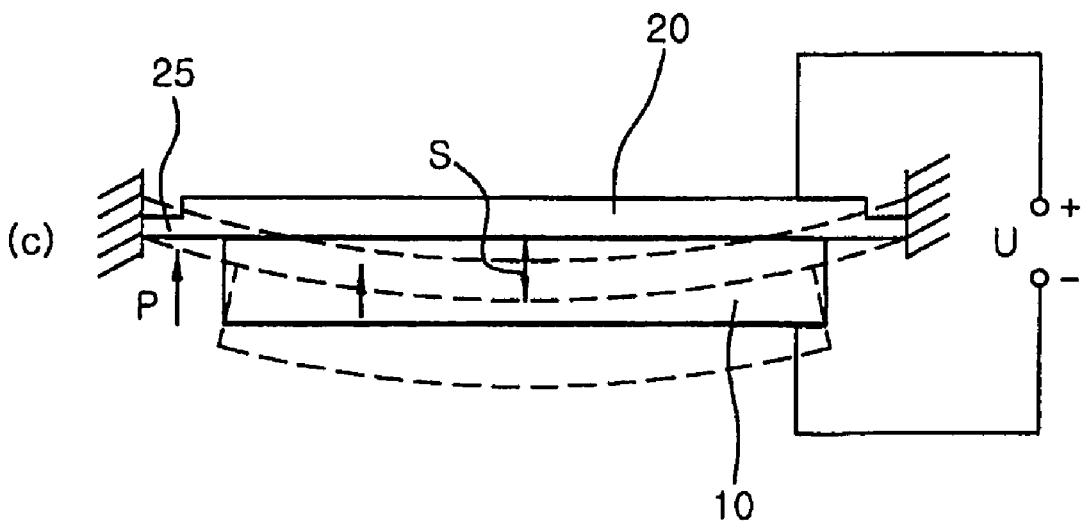
(c)

[FIG. 2]
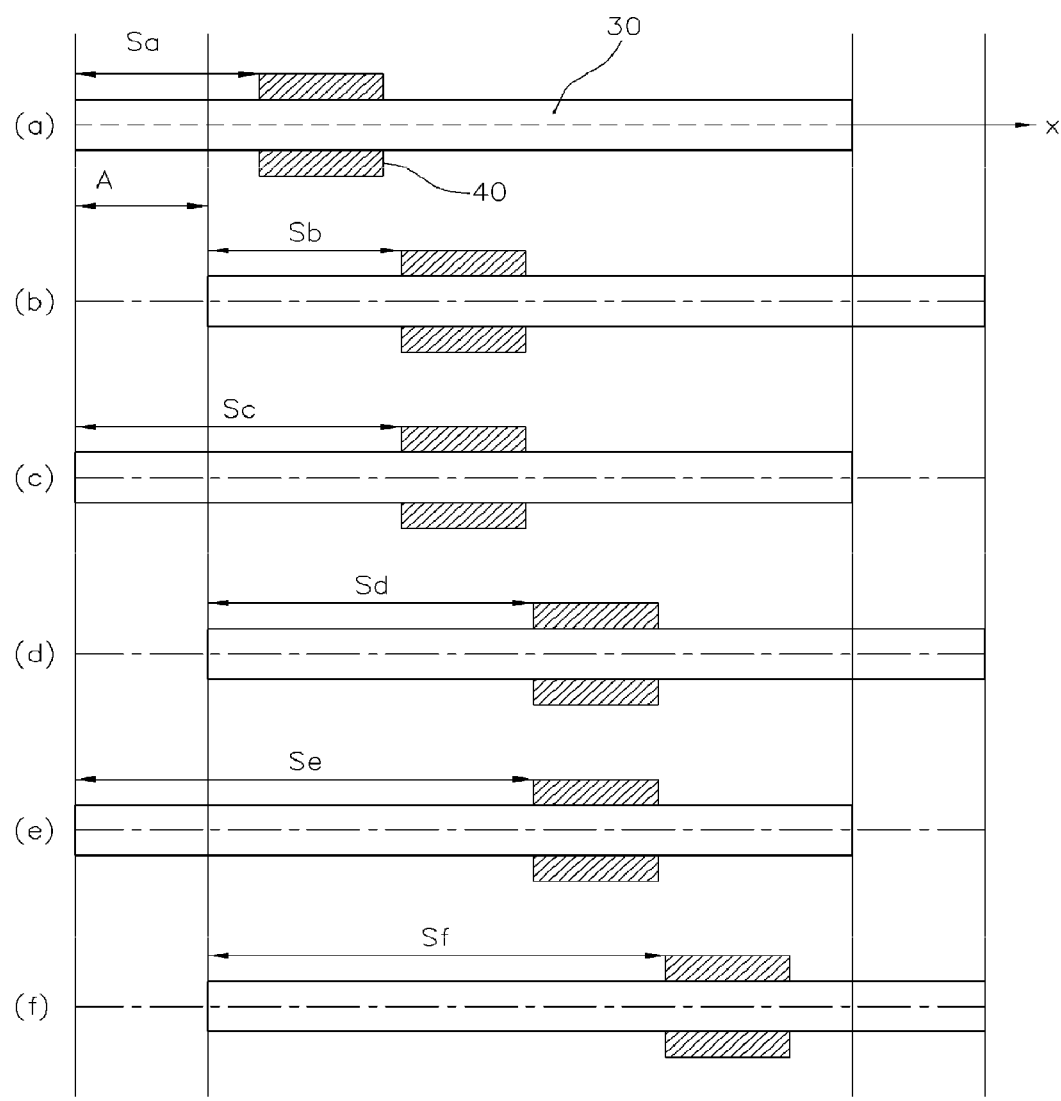

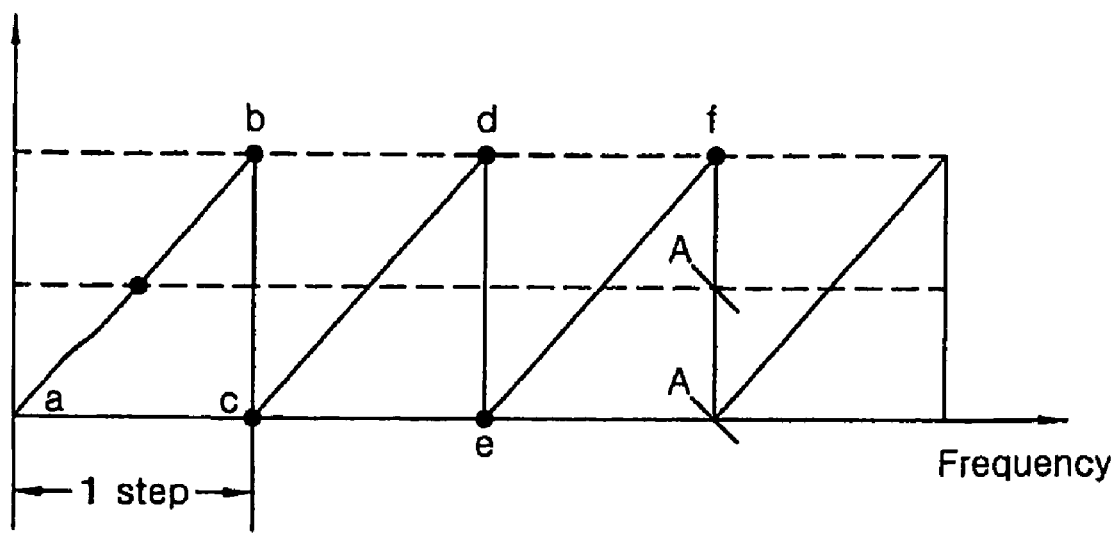
[FIG. 3]

[FIG. 4]
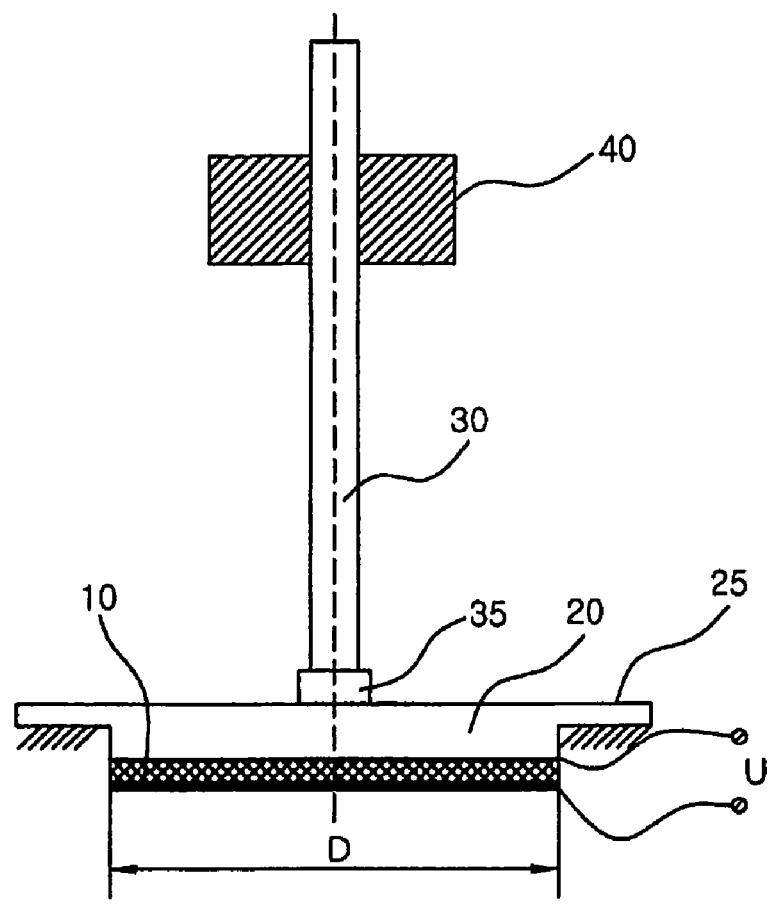
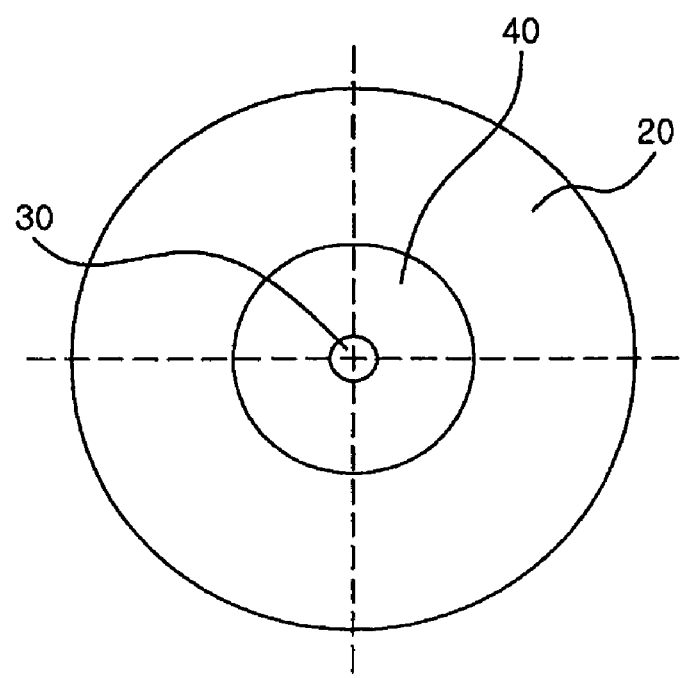

[FIG. 5]
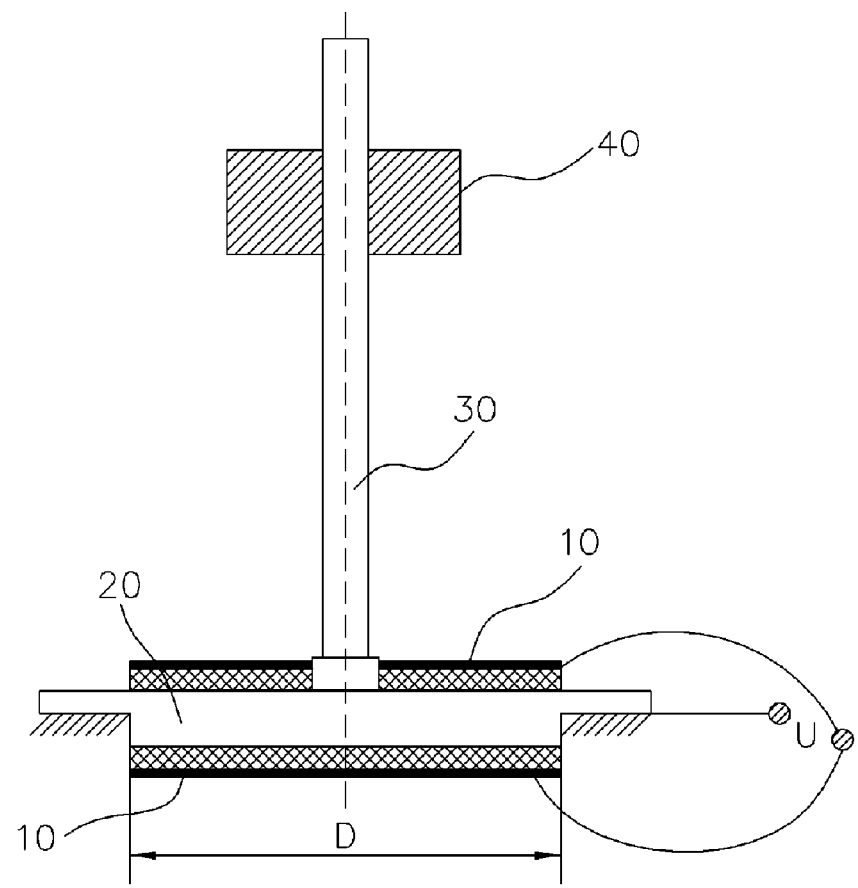
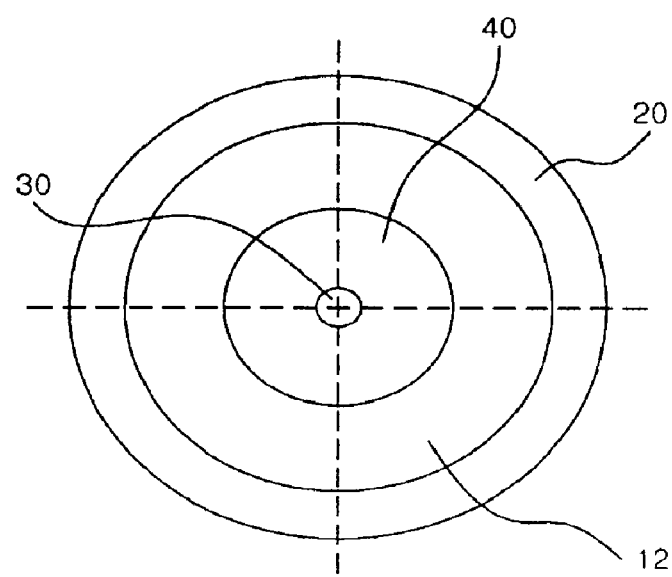

[FIG. 6]
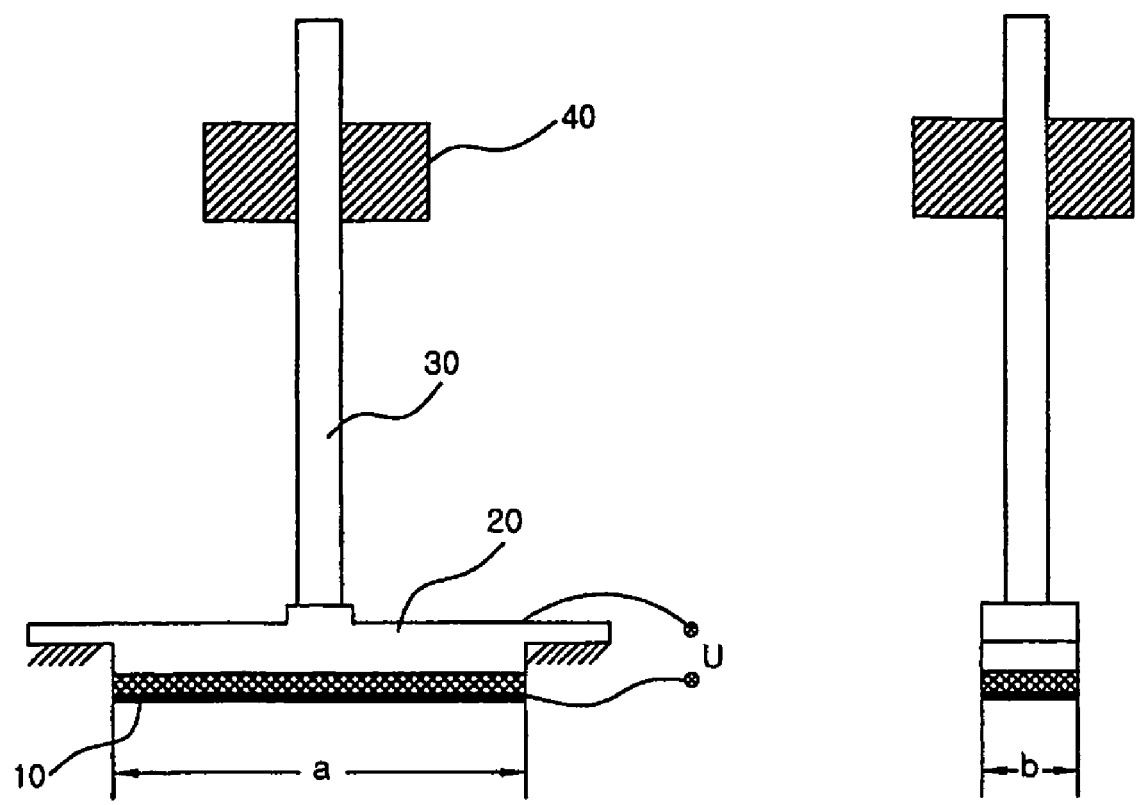

[FIG. 7]
(a)
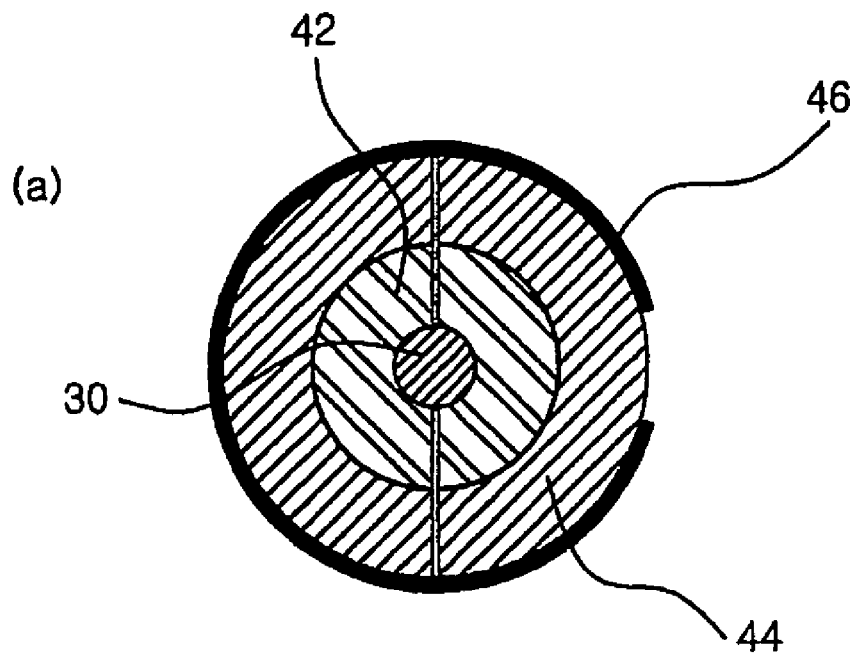
(b)
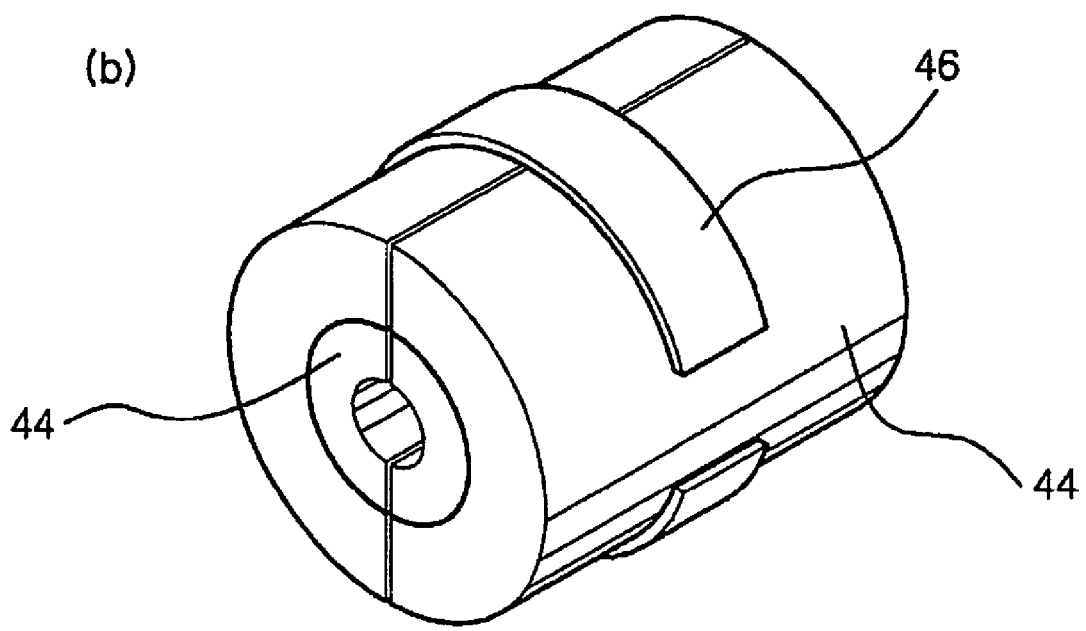

[FIG. 8]
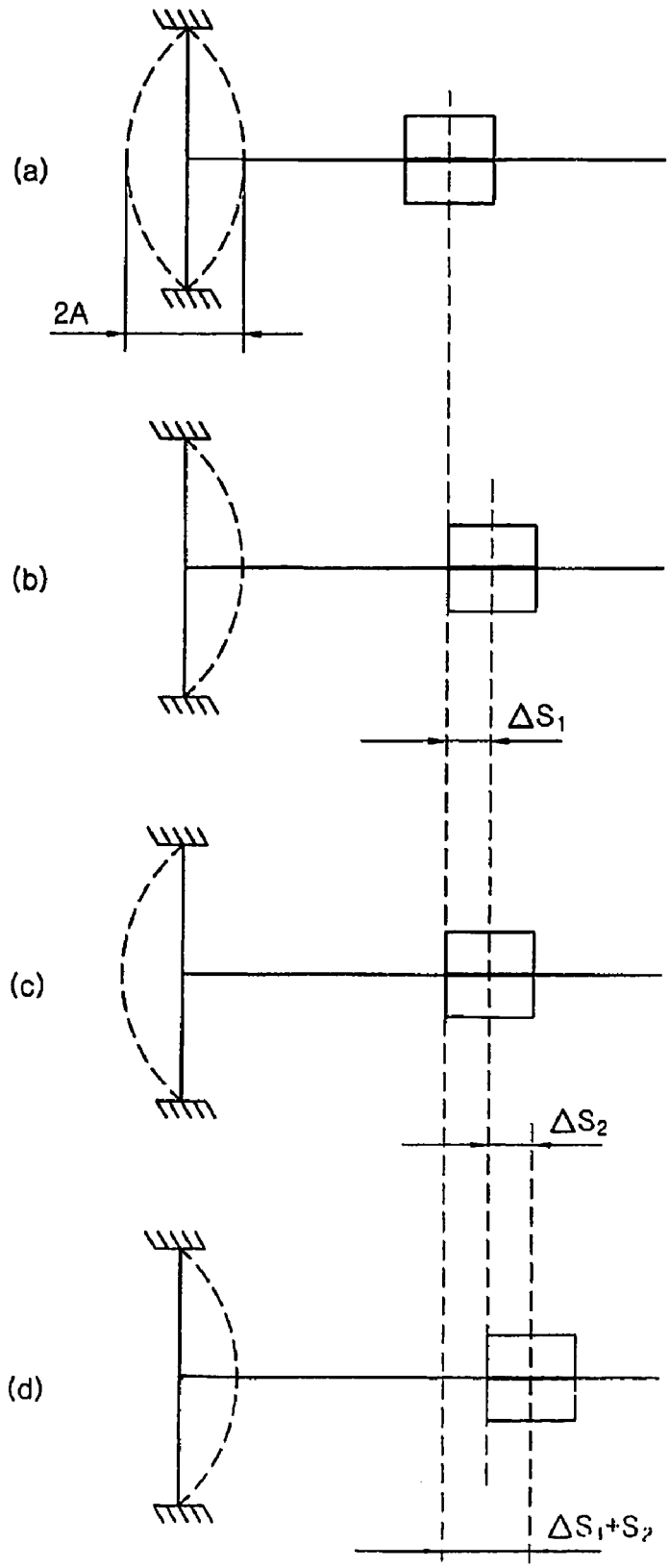

SMALL PIEZOELECTRIC OR ELECTROSTRICTIVE LINEAR MOTOR

CROSS REFERENCE TO RELATED APPLICATION

This application is a 35 USC § 371 National Phase Entry Application from PCT/KR2005/000353, filed Feb. 4, 2005, and designating the United States.

TECHNICAL FIELD

The present invention relates, in general, to small piezoelectric/electrostrictive ultrasonic linear motors which are installed in cell phones or PDAs, etc. to drive their camera lenses and, more particularly, to a small piezoelectric/electrostrictive ultrasonic linear motor in which a movable shaft 30 is coupled to a unimorph or bimorph, which is made by attaching a piezoelectric or electrostrictive substrate to an elastic body 20 (metal), so that a movable body 40 fitted over the movable shaft 30 is linearly moved along the movable shaft 30 by vibration of the piezoelectric or electrostrictive substrate, thus simplifying a manufacturing process, and being easily practicable according to a basic principle, and having a superior characteristic.

BACKGROUND ART

Small stepping motors, which may be installed in cell phones or PDAs, etc. to drive their camera lenses, must be provided with reduction gears and cams to convert high speed rotation into linear motion. Furthermore, in conventional small stepping motors, when rotated or reversely rotated, backlash occurs, thus resulting in error. Therefore, such small stepping motors have been limitedly used. In addition, the small stepping motor is problematic in that high electric current is required and excessive heat is generated.

Generally, in methods of driving linear motors using piezoelectric or electrostrictive substrates, there are a driving method of using a traveling wave generated by a flexural wave, and a driving method which uses a standing wave and in which a linear motor is provided with both a longitudinal vibration actuator and a transverse vibration actuator so that a movable unit is operated by repeated vertical and horizontal vibration. Standing wave type linear motors are provided with vibrators having different operating modes and use multiple vibrations generated by them. Such a standing wave type linear motor includes a piezoelectric/electrostrictive actuator which vibrates vertically and horizontally, and a contact part which transmits mechanical displacement to a movable body which is moving. Longitudinal vibration of a piezoelectric vibrator is transmitted to the contact part at which the movable unit is coupled to the piezoelectric vibrator. The movable body is operated by friction at a junction between it and the movable unit. In the meantime, several other vibration transmitting methods have been proposed, but, because maintaining constant vibration amplitude is difficult due to wear resulting from repeated motion over a long period of time, it is very hard to put into practical use.

First, before preferred embodiments of the present invention are explained in detail, a piezoelectric effect and vibration theory which are basic theories applied to the present invention will be described herein below for comprehension of the present invention.

Piezoelectric effect means that an electric charge is generated in a crystalline body when the crystalline body receives pressure, or, conversely, when an electric field is applied to the crystalline body, the crystalline body is mechanically displaced. A piezoelectric substrate 10 having such piezoelectric effect is characterized in that mechanical displacement is induced according to the polarization direction and the direction of the electric field.

FIG. 1 shows mechanical displacement of the piezoelectric substrate 10 according to the polarization direction and the direction of the electric field.

FIG. 1(a) shows displacement of the piezoelectric substrate 10 when an electric field is applied to the piezoelectric substrate 10 polarized in a predetermined direction. When the polarization direction of the piezoelectric substrate 10 is the same as the direction of the electric field, the piezoelectric substrate 10 is expanded in a direction designated by the reference character z and is constricted by Poisson's ratio in a direction designated by the reference character x. When the polarization direction of the piezoelectric substrate 10 is opposite to the direction of the electric field, the piezoelectric substrate 10 is constricted in a direction z and is expanded in a direction x.

FIG. 1(b) illustrates displacement of the piezoelectric substrate 10 attached to an elastic body 20. In this case, the piezoelectric substrate 10 is displaced in the same manner as that described for the case of FIG. 1(a), and bending displacement of the elastic body 20 attached to the piezoelectric substrate 10 is induced by the expansion and constriction of the piezoelectric substrate 10.

The dotted line of FIG. 1(b) denotes the shape of the elastic body 20 bent when the piezoelectric substrate 10 is expanded in a direction z. Such bending displacement of the elastic body 20 is achieved by the expansion of the piezoelectric substrate 10 while a fixed edge 25 of the elastic body 20 is held at a predetermined position.

FIG. 1(c) illustrates the elastic body 20 bent in a direction z by the expansion of the piezoelectric substrate 10 in a direction x. When the direction of the electric field is instantaneously changed, the displacement state of the piezoelectric substrate 10, which was in the state of FIG. 1(b), is quickly changed. As a result, the elastic body 20 is quickly bent in a direction z by instantaneous acceleration and expansion of the piezoelectric substrate 10 in the direction x.

Although the bending displacement of the piezoelectric substrate, when an electric field is applied, has been described, even if an electrostrictive substrate is used in place of the piezoelectric substrate, the same bending displacement as that of the case of the piezoelectric substrate is induced. The electrostriction means that an electrostrictive body is mechanically displaced when an electric field is applied to the electrostrictive body. Even if the piezoelectric substrate of FIG. 1 is replaced with the electrostrictive substrate, the same bending displacement is induced.

Therefore, in the present invention, a linear motor, which induces bending displacement using the piezoelectric or electrostrictive substrate and converts the bending displacement into linear displacement, will be described herein.

DISCLOSURE OF INVENTION

Technical Problem

The piezoelectric or electrostrictive substrate 10 used in the present invention is made of a single-crystalline ceramic, a polycrystalline ceramic or polymeric material. In the case of the piezoelectric substrate, the piezoelectric substrate may be polarized in a thickness direction of the substrate. The elastic body 20 is made of an elastic member having a predetermined thickness. In the present invention, phosphor bronze is used as the material constituting the elastic body 20. In the case that the movable shaft is coupled to the elastic body 20, a coupling hole into which the movable shaft is inserted may be formed at the center on the elastic body 20.

As described above with reference to FIG. 1, when an electric field is applied to both the elastic body 20 and the piezoelectric or electrostrictive substrate 10 which are attached to each other, bending vibration of both the elastic body 20 and the piezoelectric or electrostrictive substrate 10 is transmitted to the movable shaft. As a result, a movable body 40 linearly moves. Here, the principle of moving the movable body 40 is based on the law of inertia.

Hereinafter, preferred embodiments of the present invention which can be easily embodied by those skilled in the art will be explained in detail with reference to the attached drawings.

FIG. 2 illustrates the driving mechanism of a movable body 40 fitted over a movable shaft 30. FIG. 3 shows an input pulse applied to the piezoelectric or electrostrictive substrate 10. As shown in the drawings, in the present invention, a repeated saw-tooth pulse is used as a drive pulse.

Although not shown in FIG. 2, it is assumed that both the piezoelectric or electrostrictive substrate 10 and the elastic body 20 are coupled to a left end of the movable shaft 30 of FIG. 2 in the same manner as that shown in FIG. 1. The movement of the movable body 40 with respect to the movement of the movable shaft 30, when the saw-tooth pulse wave as shown in FIG. 3 is input as the drive pulse wave, will be explained herein below.

FIG. 2(a) and the point a of FIG. 3: a start step. The movable body 40 is placed on the movable shaft 30 at a position spaced apart from an end of the movable shaft 30 by a distance Sa.

FIG. 2(b) and the section between the point a and the point b of FIG. 3: in 1 step of FIG. 3 which is an inclined part of the saw-tooth pulse wave that represents an increase in voltage, that is, in the section in which the pulse wave from the point a to the point b is input, the movable body 40 linearly moves along with the movable shaft 30 in the direction of the x-axis by a distance A (Sa=Sb).

FIG. 2(c) and the section between the point b and the point c of FIG. 3: the voltage of the saw-tooth pulse wave of FIG. 3 varies from the point b to the point c so that the voltage becomes zero. This means that the voltage applied to the piezoelectric or electrostrictive substrate becomes zero. At this time, as shown in FIG. 2(c), the movable shaft 30 instantaneously moves to the left by a distance 2A due to a restoring force of the elastic body. Because the movable shaft 30 instantaneously moves to the left, the movable body 40 having a predetermined weight stays at the position of the distance Sc according to the law of inertia. In other words, only the movable shaft 30 moves to the left (Sc>Sb).

FIG. 2(d) and the section between the point c and the point d of FIG. 3: the movable shaft 30 moves along with the movable body 40 in the direction of the x-axis by a distance 2A (Sc=Sd).

FIG. 2(e) and the section between the point d and the point e: the movable shaft 30 and the movable body 40 move in the same manner as that described for the section between the point b and the point c.

FIG. 2(f) and the section between the point e and the point f: the movable shaft 30 and the movable body 40 move in the same manner as that described for the section between the point c and the point d.

As such, the movable body is moved by the drive of the saw-tooth pulse wave input into the piezoelectric or electrostrictive substrate, and by the elasticity of the elastic body, as well as according to the law of inertia. Such displacement is continuously and repeatedly induced by repeating the process in which the repeated bending motion of the piezoelectric or electrostrictive substrate 10 forming a unimorph or bimorph structure, that is, a single substrate or double substrate structure, is transmitted to the movable shaft 30. The movable body 40 moves from the left end to the right end of the movable shaft 30 using this principle.

In the same principle, when the direction of the saw-tooth pulse of FIG. 3 is changed and displacement induced by the changed pulse is transmitted to the movable shaft 30, the direction of the motion of the movable body 40 changes. Thus, the movable body 40 can move from the right end to the left end of the movable shaft 30. As such, the motor of the present invention is based on the law of inertia.

Technical Solution

Accordingly, the present invention has been made keeping in mind the above problems occurring in the prior art, and an object of the present invention is to provide a small piezoelectric/electrostrictive ultrasonic linear motor which is installed in a cell phone or PDA, etc. to drive its camera lens, and which is reversibly and linearly moved by ultrasonic pulse voltage applied thereto, and which has a structure capable of precisely controlling the position by varying the period of the applied voltage, and which has a simple structure, thus simplifying its manufacturing process.

Advantageous Effects

In the present invention, a small piezoelectric/electrostrictive ultrasonic linear motor having the above-mentioned construction uses bending movement of a unimorph or bimorph including both an elastic body 20 and a piezoelectric or electrostrictive substrate 10 as its driving source, so that a movable body 40 moves along a movable shaft 30. Thus, the present invention provides a small piezoelectric/electrostrictive ultrasonic linear motor which is able to simplify its manufacturing process, and easily practicable according to a basic principle, and has superior characteristics. Furthermore, the small piezoelectric/electrostrictive ultrasonic linear motor is advantageous in that its thrust is superior for its size, operation is speedy, and the drive is stable.

BRIEF DESCRIPTION OF THE DRAWINGS

FIG. 1 illustrates a principle of bending movement of both a piezoelectric or electrostrictive substrate 10 and an elastic body 20 used in the present invention;

FIG. 2 illustrates a principle of a small piezoelectric/electrostrictive ultrasonic linear motor according to the present invention;

FIG. 3 shows a saw-tooth pulse wave for driving the small piezoelectric/electrostrictive ultrasonic linear motor according to the present invention;

FIG. 4 shows a small piezoelectric/electrostrictive ultrasonic linear motor, according to a first embodiment of the present invention;

FIG. 5 shows a small piezoelectric/electrostrictive ultrasonic linear motor, according to a second embodiment of the present invention;

FIG. 6 is front and side views showing a small piezoelectric/electrostrictive ultrasonic linear motor, according to a third embodiment of the present invention;

FIG. 7 shows a movable body 40 of the small piezoelectric/electrostrictive ultrasonic linear motor according to the present invention; and FIG. 8 illustrates a principle of movement of the movable body 40 and a stator of the small piezoelectric/electrostrictive ultrasonic linear motor according to the present invention.

BEST MODE FOR CARRYING OUT THE INVENTION

In order to accomplish the above object, the present invention provides a fundamental construction which includes a piezoelectric or electrostrictive substrate 10, a movable body 40, a movable shaft 30 and an elastic body 20. Furthermore, in the present invention, various type small piezoelectric/electrostrictive ultrasonic linear motors including linear motors having three kinds of structures, which will be explained in preferred embodiments, are proposed, based on the above-mentioned fundamental construction.

FIGS. 4, 5 and 6 show three kinds of small piezoelectric/electrostrictive ultrasonic linear motors having the above-mentioned fundamental construction.

FIG. 4 shows a first embodiment of the present invention which includes a piezoelectric or electrostrictive substrate 10, an elastic body 20 and a movable body 40. The assembly of the piezoelectric or electrostrictive substrate 10 and the elastic body 20 forms a unimorph having a disk shape. The elastic body 20 is not limited to a specific material, so long as the material has a predetermined thickness and is able to efficiently transmit vibration from the piezoelectric or electrostrictive substrate 10 thereto. In the embodiments of the present invention, the elastic body 20 is made of phosphor bronze. In the case that the movable shaft 30 is directly attached to the elastic body, a protrusion 35 may be provided to support the movable shaft. In the case of the unimorph having a single piezoelectric or electrostrictive substrate 10, as shown in FIG. 4, the piezoelectric or electrostrictive substrate and the movable shaft may be provided on opposite sides of the elastic body. Alternatively, both the piezoelectric or electrostrictive substrate and the movable shaft may be provided on the same side of the elastic body. Furthermore, when the movable shaft is mounted to the center of the assembly of the piezoelectric or electrostrictive substrate and the elastic body, maximum displacement is induced. Therefore, this case is most effective.

As shown in FIG. 4, the movable shaft may be attached to a surface opposite another surface of the elastic body to which the piezoelectric or electrostrictive substrate is attached. Alternatively, as shown in FIG. 5, the movable shaft may be attached to the same surface of the elastic body to which the piezoelectric or electrostrictive substrate is attached. In this case, the piezoelectric or electrostrictive substrate is attached to a region of the surface of the elastic body other than a region of the surface of the elastic body to which the movable shaft is attached.

The piezoelectric or electrostrictive substrate 10 is polarized in a thickness direction. Furthermore, the piezoelectric or electrostrictive substrate 10 having the disk shape vibrates according to an input saw-tooth pulse wave in a direction from the outer diameter to the inner diameter or in a direction from the inner diameter to the outer diameter, thereby executing a unimorph bending movement In the first embodiment of FIG. 4, the piezoelectric or electrostrictive substrate 10 is attached to a surface of the elastic body 20. A coupling hole is formed at the center on an opposite surface of the elastic body 20 so that the movable shaft 30 is fitted into the coupling hole of the elastic body 20. The elastic body has an outer diameter larger than that of the piezoelectric or electrostrictive substrate 10 such that the elastic body is supported by a support surface. In other words, a fixed edge 25 is provided around the circumference of the elastic body 20 to fasten the linear motor to the support surface. The fixed edge serves to prevent the linear motor from undesirably moving due to the vibration of the piezoelectric or electrostrictive substrate 10.

The movable shaft 30 must be several times lighter than a bimorph which is a double structure of the elastic body 20 coupled to the piezoelectric or electrostrictive substrate 10. The movable shaft 30 has a structure capable of efficiently transmitting vibration generated by the piezoelectric or electrostrictive substrate. Furthermore, the movable shaft is manufactured such that the movable body fitted over the movable shaft can move along the movable shaft. In the present invention, a hollow shaft is used as the movable shaft. Electrodes, which are provided on both surfaces of the piezoelectric or electrostrictive substrate 10, are connected to a saw-tooth pulse voltage source (U), so that a drive pulse is input through the electrodes.

FIG. 5 shows a second embodiment of the present invention. A linear motor according to the second embodiment is a bimorph having two piezoelectric or electrostrictive substrates. Such structure is able to operate using reduced voltage, thus extending the lifetime of the linear motor. The piezoelectric or electrostrictive substrates can be polarized in a thickness direction. Here, the polarization direction of the pair of piezoelectric or electrostrictive substrates is appropriately adjusted such that generated vibration is able to reach the maximum value. Furthermore, an earth terminal is connected to the elastic body 20, so that, when a saw-tooth pulse is applied to upper and lower electrodes of the piezoelectric or electrostrictive substrates 10, the linear motor is actuated. In even the second embodiment, the piezoelectric or electrostrictive substrate, which is placed at the same side as a movable shaft 30, may be attached to a region of the surface of the elastic body other than a region of the surface of the elastic body to which the movable shaft 30 is attached. Alternatively, the movable shaft 30 may be attached to an outer surface of the piezoelectric or electrostrictive substrate, not the elastic body.

FIG. 6 shows a third embodiment of the present invention. In a linear motor according to the third embodiment, each of an elastic body and a piezoelectric or electrostrictive substrate has a rectangular plate shape, not a disk shape. This linear motor can be used in a place the length of one side of which is limited. In this embodiment, the linear motor is operated by the bending movement of a unimorph, which consists of the elastic body 20 and the piezoelectric or electrostrictive substrate 10 and has a rectangular plate shape and a size of a×b. The third embodiment may be also manufactured as the bimorph type shown in FIG. 5. In this case, the bimorph has the same shape as that described for FIG. 6.

As such, the shape of both the piezoelectric or electrostrictive substrate and the elastic body may be changed such that the shape of the piezoelectric/electrostrictive ultrasonic linear motor is suitable for a device. Furthermore, they may be changed in various shapes as well as the circular or rectangular shape.

FIG. 7 shows an example of a movable body 40 fitted over a movable shaft 30. When an input pulse is applied to the piezoelectric or electrostrictive substrate, the piezoelectric or electrostrictive substrate vibrates along with the elastic body. This vibration is transmitted to the movable shaft. Then, the movable body 40 moves along the movable shaft. As such, the vibration of the piezoelectric or electrostrictive substrate is converted into the linear motion of the movable body 40.

The structure of the movable body 40 of FIG. 7 is merely one example of the movable body of the present invention.

Therefore, the movable body 40 is not limited to a specific structure, so long as predetermined friction between the movable shaft 30 and the movable body 40 is maintained and the movable body 40 has a predetermined weight according to the law of inertia.

The movable body is a metal body or substance having a predetermined weight. In addition, the movable body is in close contact with the movable shaft and is manufactured such that constant friction is maintained at a junction between the movable shaft and the movable body. Furthermore, the movable body has a singe body.

The movable body is in close contact with the outer surface of the movable shaft to cover at least part of the movable shaft, thus maintaining constant friction. Preferably, the movable body has a structure capable of being fitted over the movable shaft. Furthermore, the movable body must be manufactured such that it is applicable to the law of inertia using the frictional force and the predetermined weight.

To achieve the above-mentioned purpose, as shown in FIG. 7, the movable body 40 of the present invention includes a friction member 42 which is in close contact with the outer surface of the movable shaft, thus providing the constant friction. The movable body 40 further includes a weight 44 which is provided around an outer surface of the friction member 42 and covers at least part of the friction member 42. The weight 44 is made of metal of a predetermined weight. The movable body 40 further includes an elastic shell 46 which is fitted over an outer surface of the weight 44 to reliably couple the weight 44 to the friction member 42.

Referring to FIG. 7, the movable body may consist of two subcylindrical bodies, each of which has a friction member being in contact with the movable shaft and a metal body that has a predetermined weight and is provided around an outer surface of the friction member. The subcylindrical bodies are held around the movable shaft by the elasticity of the elastic spring.

When the movable body 40 is held around the movable shaft 30 by an optimum force, superior performance of the linear motor is achieved. For this, the elastic spring 46 having a predetermined elasticity is fitted over the movable body, thus providing the optimum holding force by which the movable body 40 is held around the movable shaft 30.

In the present invention, a nonmetallic member having a braking function is used as the friction member. The weight is made of dense metal.

FIG. 8 shows the movement of the movable body 40 fitted over the movable shaft 30 of the linear motor and the unimorph or bimorph. In this drawing, the movement of both the movable shaft 30 and the movable body 40, which depends on the movable shaft 30, by the bending movement of the unimorph or bimorph is illustrated. It is understood that the movable body 40 is moved by the displacement of the unimorph or bimorph.

The invention claimed is:

1. A piezoelectric/electrostrictive ultrasonic linear motor, comprising:
   a piezoelectric or electrostrictive substrate, with an electrode provided on each of both surfaces of the piezoelectric or electrostrictive substrate;
   an elastic body, to one surface or each of both surfaces of which the piezoelectric or electrostrictive substrate is attached;
   a movable shaft coupled at an end thereof to the elastic body or the piezoelectric or electrostrictive substrate attached to the elastic body, the movable shaft being operated in conjunction with displacement of the piezoelectric or electrostrictive substrate; and
   a movable body to be moved along the movable shaft.

2. The piezoelectric/electrostrictive ultrasonic linear motor according to claim 1, wherein the piezoelectric or electrostrictive substrate is polarized.

3. The piezoelectric/electrostrictive ultrasonic linear motor according to claim 2, wherein the movable body is in close contact with an outer surface of the movable shaft such that the movable body covers at least part of the movable shaft.

4. The piezoelectric/electrostrictive ultrasonic linear motor according to claim 3, wherein the movable shaft has a circular or angled slender rod shape and transmits vibration of the piezoelectric or electrostrictive substrate at high efficiency.

5. The piezoelectric/electrostrictive ultrasonic linear motor according to claim 1, wherein a weight of the movable body and a frictional force between the movable shaft and the movable body are provided so that the movable body is moved along the movable shaft when the movable shaft vibrates in conjunction with the displacement of the piezoelectric or electrostrictive substrate.

6. The piezoelectric/electrostrictive ultrasonic linear motor according to claim 1, wherein the movable body comprises: a friction member being in close contact with an outer surface of the movable shaft; a weight provided around an outer surface of the friction member; and an elastic shell fitted over an outer surface of the weight to hold both the friction member and the weight around the movable shaft, wherein the movable body is fitted over the movable shaft.

7. A method of driving a piezoelectric/electrostrictive ultrasonic linear motor, having an elastic body to which at least one piezoelectric or electrostrictive substrate is attached; a movable shaft coupled to the elastic body or the piezoelectric or electrostrictive substrate attached to the elastic body; and a movable body to be moved along the movable shaft, the method comprising:
   the step (a) of applying a voltage, which varies from a first voltage to a second voltage, to electrodes provided on both surfaces of the piezoelectric or electrostrictive substrate during a first period; and
   the step (b) of applying a voltage, which varies from the second voltage to the first voltage, to the electrodes provided on both surfaces of the piezoelectric or electrostrictive substrate during a second period after the step (a), wherein,
   the movable body is moved along with a movement of the movable shaft in conjunction with displacement of the piezoelectric or electrostrictive substrate during the step (a) or step (b), to move along the movable shaft.

8. The method of driving the piezoelectric/electrostrictive ultrasonic linear motor according to claim 7, wherein the step (a) and step (b) are repeated.

9. The method of driving the piezoelectric/electrostrictive ultrasonic linear motor according to claim 7, wherein the first period is longer than the second period.

10. The method of driving the piezoelectric/electrostrictive ultrasonic linear motor according to claim 7, wherein the first period is shorter than the second period.

11. The method of driving the piezoelectric/electrostrictive ultrasonic linear motor according to claim 7, wherein, during the second period, the movable body is moved along with the movement of the movable shaft, so that the movable body is moved along the movable shaft.

12. The method of driving the piezoelectric/electrostrictive ultrasonic linear motor according to claim 7, wherein, during the first period, the movable body is moved along with the movement of the movable shaft, so that the movable body is moved along the movable shaft.

13. The method of driving the piezoelectric/electrostrictive ultrasonic linear motor according to claim 7, wherein the movable body is moved along with the movement of the movable shaft during one of the step (a) and step (b), and the movable body is not moved back to a position of the movable shaft during the other one of the step (a) and step (b).

14. The method of driving the piezoelectric/electrostrictive ultrasonic linear motor according to claim 7, wherein the movable shaft is moved in conjunction with displacement of the piezoelectric or electrostrictive substrate between a first position and a second position, and the movable body is moved along with the movement of the movable shaft in response to the piezoelectric or electrostrictive substrate being displaced toward the second position and the movable body is not moved back to a position of the movable shaft in response to the piezoelectric or electrostrictive substrate being displaced toward the first position.

15. The piezoelectric/electrostrictive ultrasonic linear motor according to claim 1, wherein the piezoelectric or electrostrictive substrate is polarized in a thickness direction of the piezoelectric or electrostrictive substrate, or a polarization direction of the piezoelectric substrate is the same as a direction of an electrical field applied to the piezoelectric substrate.

16. The piezoelectric/electrostrictive ultrasonic linear motor according to claim 1, wherein the movable shaft is moved in conjunction with bending displacement of the elastic body and the one or more piezoelectric or electrostrictive substrate attached thereto, to move the movable body.

17. The piezoelectric/electrostrictive ultrasonic linear motor according to claim 16, wherein one or more edge/end of the elastic body or the piezoelectric or electrostrictive substrate is fixed.

18. The piezoelectric/electrostrictive ultrasonic linear motor according to claim 17, wherein the movable shaft is coupled towards a center of to the elastic body or the piezoelectric or electrostrictive substrate attached to the elastic body.

19. The piezoelectric/electrostrictive ultrasonic linear motor according to claim 1, wherein the movable shaft is moved in conjunction with displacement of the piezoelectric or electrostrictive substrate between a first position and a second position, and the movable body is moved along with a movement of the movable shaft in response to the piezoelectric or electrostrictive substrate being displaced toward the second position and the movable body is not moved back to a position of the movable shaft in response to the piezoelectric or electrostrictive substrate being displaced toward the first position.

* * * * *